US006762974B1

(12) United States Patent
Johnson et al.

(10) Patent No.: US 6,762,974 B1
(45) Date of Patent: Jul. 13, 2004

(54) METHOD AND APPARATUS FOR ESTABLISHING AND MAINTAINING DESIRED READ LATENCY IN HIGH-SPEED DRAM

(75) Inventors: Brian Johnson, Boise, ID (US); Brent Keeth, Boise, ID (US); Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/389,807

(22) Filed: Mar. 18, 2003

(51) Int. Cl.$^7$ ................................................ G11C 8/00
(52) U.S. Cl. ...................... 365/233; 365/194; 365/236
(58) Field of Search ................................. 365/233, 194, 365/236; 327/156, 158

(56) References Cited

U.S. PATENT DOCUMENTS 5,745,421 A * 4/1998 Pham et al. ................. 365/203
5,825,226 A * 10/1998 Ferraiolo et al. ............ 327/250
5,999,580 A * 12/1999 Sakoda et al. ............... 375/354
6,269,051 B1 * 7/2001 Funaba et al. ............... 365/233
6,621,762 B1 * 9/2003 Roohparvar ................. 365/233

* cited by examiner

Primary Examiner—Son T. Dinh
(74) Attorney, Agent, or Firm—Dickstein Shapiro Morin & Oshinsky LLP (57) ABSTRACT

A method and apparatus for managing the variable timing of internal clock signals derived from an external clock signal in order to compensate for uncertainty and variations in the amount of read clock back timing relative to data flow to achieve a specified read latency. A reset signal is generated at DRAM initialization and starts an first counter, which counts external clock cycles, and is also passed through the slave delay line of the delay lock loop to start a second counter. The counters run continuously once started and the difference in count values represent the internal delay as an external clock signal passes through the delay lock loop to produce an internal read clock signal. An internal read latency value is used to offset either counter to account for the internal read latency of the DRAM circuit. Once the non-offset counter is equivalent to the offset counter, read data is placed on an output line with a specified read latency and synchronized with the external read clock.

56 Claims, 6 Drawing Sheets

| FIG. 1A | FIG. 1B |

| FIG. 2A | FIG. 2B |

METHOD AND APPARATUS FOR ESTABLISHING AND MAINTAINING DESIRED READ LATENCY IN HIGH-SPEED DRAM

FIELD OF THE INVENTION

The present invention relates to DRAM circuits and, more specifically to a circuit and method for maintaining a desired read latency in a high speed DRAM.

BACKGROUND OF THE INVENTION

A typical DRAM memory system has an external DRAM controller that makes read and write requests to a DRAM memory device. When making a read request the controller expects data within the memory device to be available on a data bus within a predetermined read latency, which is usually a predetermined number of system clock cycles, which are external to the DRAM device, after a read request is made by the controller e.g., eight external clock cycles.

The problems with maintaining read data latency in high speed DRAM arise from the necessity to align data with the external clock using an internal delay locked loop (DLL), which generates timing signals, including a read clock signal, for internal DRAM operations. The phase relationship between the external DRAM clock, an internal command/address capture clock and the DLL output clock, which is used to generate the read clock signal, is completely arbitrary and dependent on frequency and process, voltage, and temperature (PVT) variations. The command capture clock is delayed relative to the external clock by the clock receiver and other clock distribution delays. The DLL is back timed relative to the external clock by the delay of the data output circuits, but receives its input from an internal clock receiver and also has adjustments made to its output signals that are not synchronized with the external clock. A difference in phase near or greater than a complete clock cycle creates difficulty in controlling timing between the command/address capture clock domain and the DLL clock domain.

As noted, internally, the DRAM memory device has its own DLL driven clock system that receives the external clock signal and develops from the external clock several different internal clock signals, including a read clock signal, for internal operation of the memory device. The internal clock system of a known high speed memory device produces at least two clock domains. The first clock domain represents the timing used in the bulk of the logic circuits and to drive the memory array core. The timing for the first domain is produced from the internal clock receiver, which is buffered from the external free running system clock. The phase of the clock signal in the first domain relative to the external clock is dependent upon delays in the clock receiver that receives the external clock signal. The second domain, also derived from the external system clock, represents the timing of a back-timed read clock signal. This clock domain is produced by the delay lock loop DLL and associated clock trees. This second clock domain produces a read clock, for operating data read latches. The read clock is provided to the read latch with a desired phase relationship to the external system clock. The second clock domain compensates for delays in the data output path in order to produce a read clock signal that operates the output data latches to achieve a specified phase alignment with the external system clock.

Neither of these two clock domains truly accurately reflects the timing of the external system clock, particularly at high frequencies of operation and the timing of the clock signals in the two domains may criss-cross one another during memory device operation due to process, voltage and temperature (PVT) variations. Consequently, a problem may arise in that one clock domain responsible for delivery of read data to an output latch may cause this data to be delivered at a different time from when the back-timed read clock for latching that data is present at the latch, or when the data is actually required to be driven to an external bus.

In order to meet a specified read latency the memory device must be able to count clock signals following receipt of a READ command and activate the output latch and data driver to latch output data with the back-timed read clock and drive the bus at the precise time necessary to produce the specified read latency.

Since the amount of read clock back-timing becomes indeterminate during high speed operation relative to the data availability, it is very difficult to control the read clock and guarantee a correct data output and a specific read latency as measured in external clock cycles.

BRIEF SUMMARY OF THE INVENTION

The present invention provides a method and apparatus compensating for uncertainty and variations in the amount of read clock back timing relative to data flow in order to maintain a specified read latency. The present invention is a DRAM circuit that utilizes the DLL loop delay as a reference in order to maintain a specified read latency. The loop delay of the DLL represents the number of clock cycles it takes for a clock edge to travel from the reference input of the phase detector of the DLL to the feedback input of the phase detector. Under ideal conditions, the phase difference between the two clock signals is 0 degrees. As a result, the delay component of the DLL can be used to maintain a specified read latency for a high speed DRAM.

In addition, the present invention utilizes a slave delay line to the primary DLL line in order to track adjustments made to the primary delay line used for DLL output clock adjustments. The slave delay line can be used to transfer a signal that is synchronized to the DLL input clock domain so the signal arrives at the output of the slave delay line synchronized to the DLL output clock domain thereby experiencing the same delay. Consequently, the delayed signal is subject to the same PVT or other timing variations that is experienced by the primary DLL line and is back-timed for output path delays by the same amount as the DLL primary signal.

In the present invention, a reset signal is generated at DRAM initialization and starts an upstream counter, which counts external clock cycles, and is also passed through the slave delay line to start a downstream counter which counts clock signals corresponding to the read clock signals provided by the DLL and associated clock tree. The counters run continuously once started and the difference in count values represent the internal delay as an external clock signal passes through the DLL to produce an internal read clock signal.

In one embodiment, when a READ command is received from an external controller, the contents of the upstream counter are loaded into a FIFO/Adder. This count value is altered by either adding or subtracting the internal read latency value IRLVAL, a value generated by a latency offset calculator, calculating the internal read latency of the DRAM circuit from various parameters. The sum of IRLVAL with the value of the upstream counter produces a compensated count value, CCVAL. The compensated count value is compared with the count value produced by the downstream counter in a comparator.

Once the downstream count has a count value equivalent to the compensated count value, the comparator passes a signal to a line driver enable counter, which in turn passes an output signal to the output circuit to cause read data to be placed on an output line latched into an output latch by a read clock generated by the DLL with a specified read latency. In burst mode, the line driver enable counter passes multiple output signals to the output circuit for each data signal of a burst.

Thus, even if the back-timing of the read clock output varies, the output data is placed on the output line in synchronism with the external read clock.

In a second embodiment, the internal read latency value is used to offset the count value of the downstream counter instead of the upstream counter.

The foregoing and other features of the invention will become more apparent from the detailed description of the exemplary embodiments of the invention given below in connection with the accompanying drawings.

DETAILED DESCRIPTION OF THE INVENTION

The present invention compensates for uncertainty and variation in the amount of read clock back-timing in a DRAM memory device by delivering data to a bus output which is properly timed to the back timed read clock and synchronized with an external clock in order to ensure that proper data is delivered to the data bus with a specified read latency.

Figures 1, 1A:
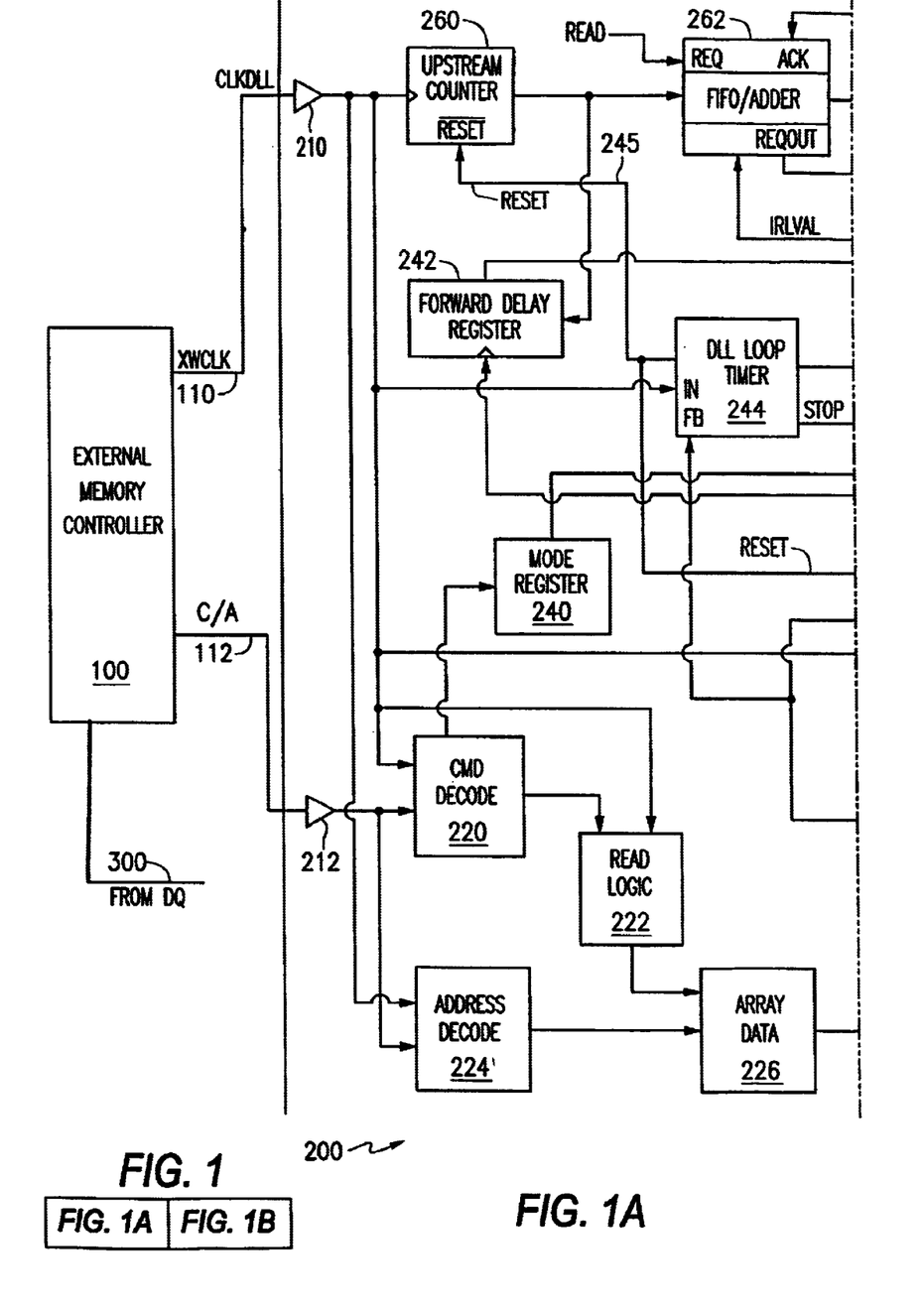
FIG. 1 is a block diagram illustrating an exemplary embodiment of the invention.
Figure 1B:
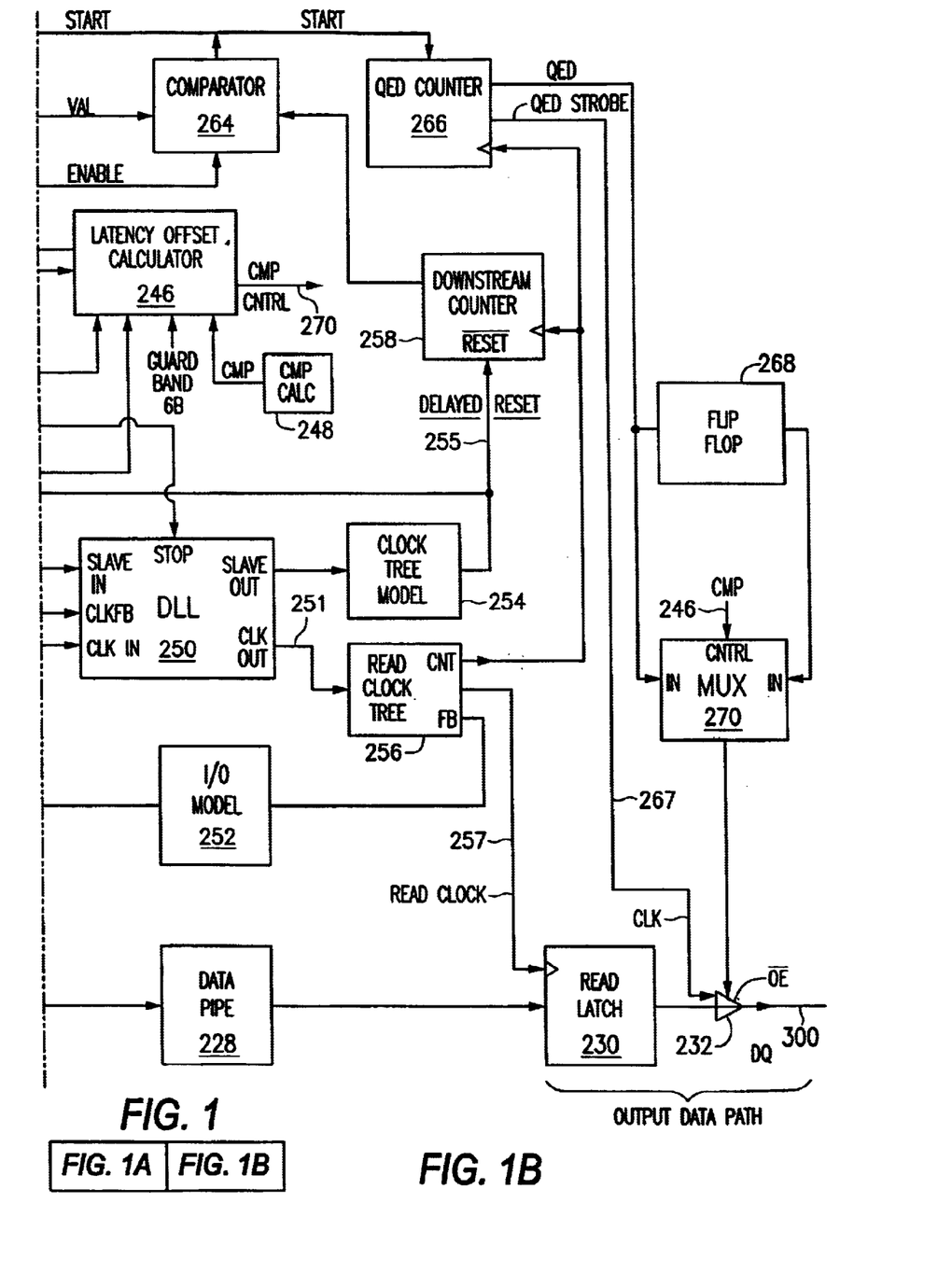

FIG. 1 illustrates the operative part of a first embodiment of the invention as used in a memory device 200. An external memory controller 100 supplies an external system clock XWCLK to memory device 200 on external clock line 110 and command and address signals C/A on command/address bus 112. Memory array data between the controller 100 and memory device 200 are exchanged over a multi-bit data bus, which is represented in FIG. 1 by one data line 300 of the bus. Since the invention is directed particularly at the timing of read operations that occurs within the memory device 200, the data line 300 is shown as delivering selected read data from a memory array 226 through a data pipe 228 to a read latch 230 to a line driver 232 to data line 300 and into memory controller 100. The data pipe 228 includes a serializer for converting array data delivered in parallel to serial data for delivery to output DQ path 300.

The memory device 200 further includes a clock buffer 210 for receiving and buffering the external system clock XWCLK, a command/address buffer 212 for receiving and buffering command and address signals appearing on command and address bus 112, and a command CMD latch and decoder 220 for latching and decoding incoming commands from the memory 100. A READ command decoded by the command decoder 220 is utilized to initiate a read operation on the memory array 226. A read operation is initiated through the control logic of the memory device 200, which is depicted in FIG. 1 as the read logic 222, which operates the memory array 226 to read out data from one or more memory addresses as specified by the controller 100 that are decoded by address decoder 224. The read logic is driven by the buffered external system clock signal XWCLK 110.

The buffered external clock is also applied to a DLL 250, which in combination with clock tree 256, produces additional internal clocking signals for the memory device 200, one of which is the read clock signal on line 257 used to latch output data from the memory array. As discussed above, the read clock signal produced by DLL 250 and clock tree 256 is back-timed by the delay in the output path. A particular edge of the read clock signal is chosen to drive the output read latch 230 to achieve a specified read latency for a data read from array 226.

The command/address bus signal passes through the command/address buffer 212 and is input into the command CMD latch/decoder 220 and address latch/decoder 224 to appropriately read in command and address data from memory controller 100.

In order to ensure that the read data is delivered to the bus line 300 in properly timed relationship, notwithstanding PVT or other timing variations, the invention employs an upstream counter 260, a first in first out register and adder 262, a comparator 264, a counter 266, a downstream counter 258, a forward delay register 242, a latency offset calculator 246, a DLL loop timer 244, and a slave delay path that is part of DLL 250. These circuits cooperate to provide an enable signal to an output bus driver 232 to ensure that read output data is delivered to bus 300 with a proper latency as measured in external system clock cycles.

The following values are required by the internal read latency calculator 246 in order to ensure that read data and the enable signal for the output driver 232 arrive at the output driver 232 in a properly timed relationship:

A value N, representing the number of cycles required for a signal to traverse the entire delay lock loop 250, clock tree model 254 and I/O Model 252 is supplied to the latency offset calculator 246. The value N also represents the number of external clock cycles a signal would take to traverse the die from input clock pad to output data pad when timed by the delay lock loop clock domain. The value N is determined by the DLL loop timer 244 that measures the DLL 250 loop delay, clock tree model 254 delay and I/O Model 252 delay during device initialization.

Figure 3:
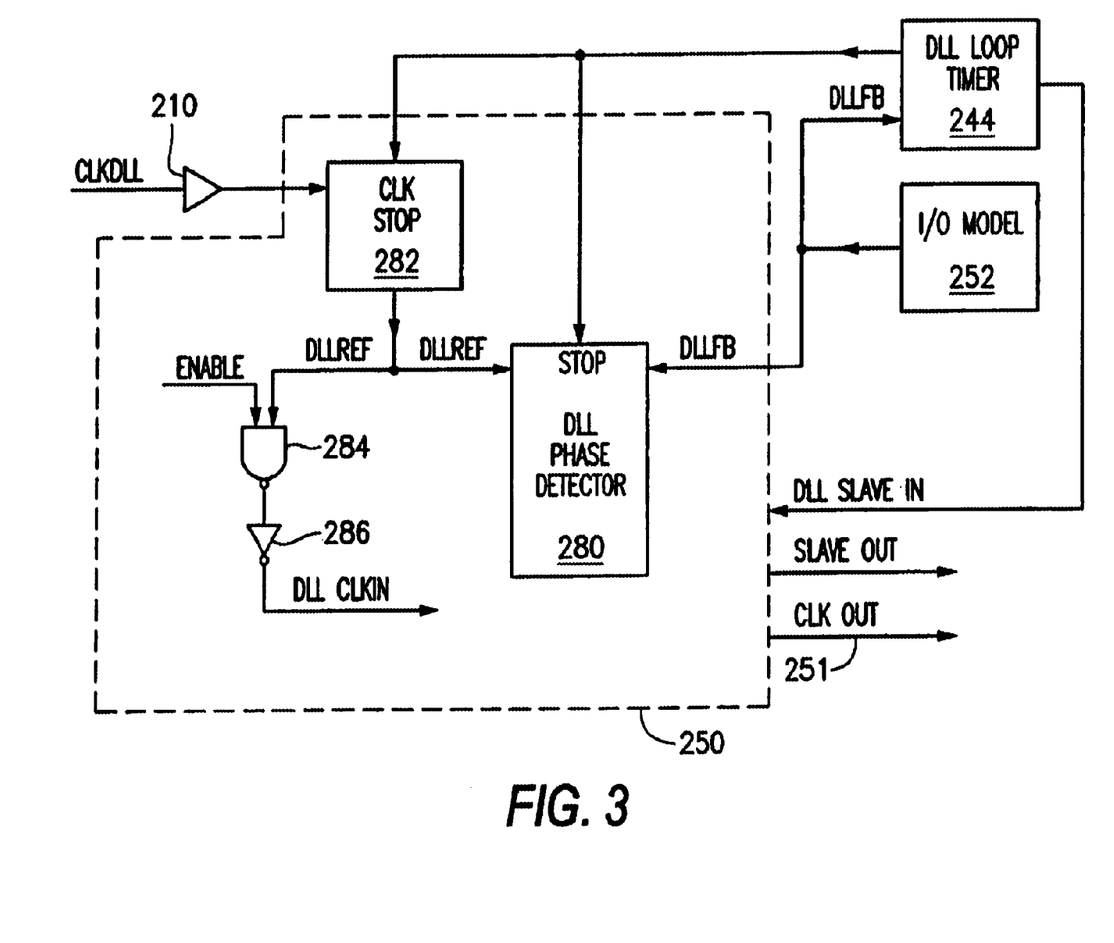
FIG. 3 is a block diagram illustrating the operation of a DLL when calculating a value N.

During device initialization, which is represented in FIG. 3, the DLL 250 locks, prompting the DLL loop timer 244 to begin counting external clock cycles received from buffer receiver 210. The DLL loop timer 244 sends a stop signal to the DLL 250 to prevent further changes to the delay line by the DLL phase detector 280. The DLL loop timer 244 then sends a suppressed pulse through the reference input of the DLL 250 phase detector 280 creating a perturbation of the clock signal. For example, the perturbation can be a missing clock pulse as long as the pulse does not impact the operation of DLL support circuitry. The suppressed pulse is subsequently output to the read clock tree 256. When the read clock tree 256 receives an input signal from the DLL 250, the read clock tree 256 outputs a feedback signal to the I/O Model 252, which is then input back into the DLL 250 feedback input to the phase detector 280 creating a feedback loop. The I/O Model 252 allows the DLL 250 to detect and compensate the timing of the arriving feedback signal to account for expected PVT variations of the I/O circuits for the device.

The feedback signal supplied to the DLL 250 phase detector 280 by the I/O Model 252 is also supplied to the DLL loop timer 244, and notifies the DLL loop timer 244 to stop counting clock cycles when it receives the clock perturbation. The DLL loop timer 244 in turn sends the count value back to the DLL 250 phase detector 280 in order to set the sample and adjust rate of the DLL 250 phase detector 280. The number of clock cycles for the suppressed signal to traverse the DLL loop is the value N.

During the process of calculating N, the reset signal of the upstream and the delayed reset signal, which is the reset signal delayed by the slave delay circuit of the DLL 250, of the downstream counter are in a logic state preventing both counters from counting clock cycles.

In addition to using the value N from the DLL timer 244, the latency offset calculator is supplied a value L from the mode register representing the number of external clock cycles between the issued read command and when read data is to be driven onto the data bus 300. In the FIG. 1 circuit, the value L may either be supplied to the latency offset calculator 246 by the mode register 240 or programmed during the initialization of the latency offset calculator 246.

While value N is calculated by the DLL loop timer 244, a reset signal is issued simultaneously with the missing clock pulse by the DLL loop timer 244 on line 245. The reset signal is applied to an upstream counter 260, which begins to count through a recirculating counter the number of external system clock cycles delivered through the clock buffer 210. The reset signal is also applied to a slave delay line in the DLL 250, which is slaved to the timing of delay lock loop 250. The output of the slave delay line in the DLL 250 is applied to a clock tree model 254, which replicates delays experienced by the read clock passing through clock tree 256. Thus, any timing variations imparted to the read clock signal on line 257 produced by the DLL 250 are also imparted to the reset signal 245 passing through clock tree model 254. Consequently, the reset signal is subject to the same PVT or other timing variations that is experienced by the read clock signal on line 257 and is back-timed for output path delays by the same amount as the read clock signal on line 257. The reset signal is output from the clock tree model 254 as a delayed reset signal on line 255. The reset signal is sent at the same time as the missing pulse because the missing pulse in the downstream counter 258 provides greater timing margin for starting the downstream counter 258. This guards against a mismatch between the DLL 250 slave delay line and the true delay line.

A clock signal from read clock tree 256 is applied to a downstream recirculating counter 258, which counts the clock output of the read clock tree 256 beginning when the delayed reset signal appears on line 255. Consequently, the upstream and downstream counters are both counting external clock signals, but the downstream counter value lags the upstream counter value by the delay inherent in DLL 250 and clock tree 256.

The delayed reset signal 255 is also used to latch a count value D present in the upstream counter 260 into a forward delay register 242 at the time the delayed reset signal is input to the reset input of the downstream counter 258. The value D in forward delay register 242 is rounded up to the nearest half cycle by clocking the forward delay register 242 on the opposite edge of the DLL 250 input clock relative to the clock edge being counted by the upstream counter.

Once the forward delay register 242 is latched with the count value D, which approximates the number of external cycles for a clock signal to pass through the slave delay line in the DLL 250, read clock tree 256 and reset(start) the downstream counter 258, it is supplied to the latency offset calculator 246.

When the latency offset calculator 246 receives the value L from the mode register 240, a value CMP is calculated by CMP calculator 248 and used by the latency offset calculator 246. CMP value represents the number of external cycles of compensation necessary for read latency timing generation in integer clock cycles because of internal signal distribution delays and a read strobe preamble.

Lastly, a value guard band value (GB) is hardwired into the latency offset calculator representing the number of cycles that may safely be removed from the calculation of internal read latency and still remain within an acceptable timing needed to have data available at the output of output buffer 232 for a specified external read latency. Once the read latency calculator 246 receives all of these values, the following calculation is performed at initialization and utilized to determine a desired internal read latency:

If (L−N)>=CMP then
    add (L−N)−CMP cycles to the upstream counter value
    else if CMP−(L−N)<=D—guard band then
    subtract CMP−(L−N) cycles from the upstream counter value else
    subtract D—guard band cycles from the upstream counter value.

The internal read latency calculations yield an internal read latency value that is supplied to the FIFO/Adder 262.

The FIFO/Adder 262 receives a count input from the running upstream counter 260 upon the receipt of a READ command at the REQ input of the FIFO/Adder 262. The internal read latency value (IRLVAL) is either a positive or a negative value depending on the previous calculation by the latency offset calculator 246, and is added to a count value supplied by the upstream counter 260 in the FIFO/Adder 262. The sum provided by the FIFO/Adder 262 is the compensated counter value, CCVAL.

Once the FIFO/Adder 262 calculates CCVAL, the REQOUT signal from the FIFO/Adder enables comparator 264. Once enabled, the compensated counter value (CCVAL) from FIFO/Adder 262 is read into comparator 264. Also supplied to the comparator 264 is the running count value of the downstream counter 258. When the downstream counter 258 counts to a value equivalent to the compensated counter value (CCVAL), the comparator 264 supplies a start signal to the counter 266, which also serves as an acknowledgment signal to the ACK input of the FIFO/Adder 262.

If the memory device is not operating in a burst mode and only one cycle of data needs to be supplied to the memory controller 100, then a single pulse is supplied by the counter 266 to the multiplexer 270, which is passed synchronously to the read latch 230, which in turn synchronously enables the output buffer 232 to allow read data, which was located in the read latch 230 by the internal read clock onto the bus line 300. The output of counter 266 is also supplied to a flip-flop 268, which has the effect of delaying the output of counter 266 by one clock cycle to compensate for additional unaccounted delays. The output of flip flop 268 is supplied as another input to multiplexer 270. The control signal for the multiplexer 270 is CMP, which is supplied to the multiplexer 270 by the latency offset calculator 246. Accordingly, an additional delay can be provided, if needed, by the latency offset calculator 246.

The output signal 267 generated by multiplexer 270 is synchronized at the read latch 230 and strobes the enable output buffer 232 and allows data onto the bus line 300.

If the memory controller 100 requests multiple data items, i.e. the memory device is operating in a burst mode. The counter 266 receives and counts a clock output CNT from the read clock tree 256 and for each clock pulse applies a pulse to the inputs of multiplexer 270 at flip-flop 268 until a burst count is reached. The successive outputs from counter 266 are used in synchronizing each of the data outputs in the burst.

Figures 2, 2A:
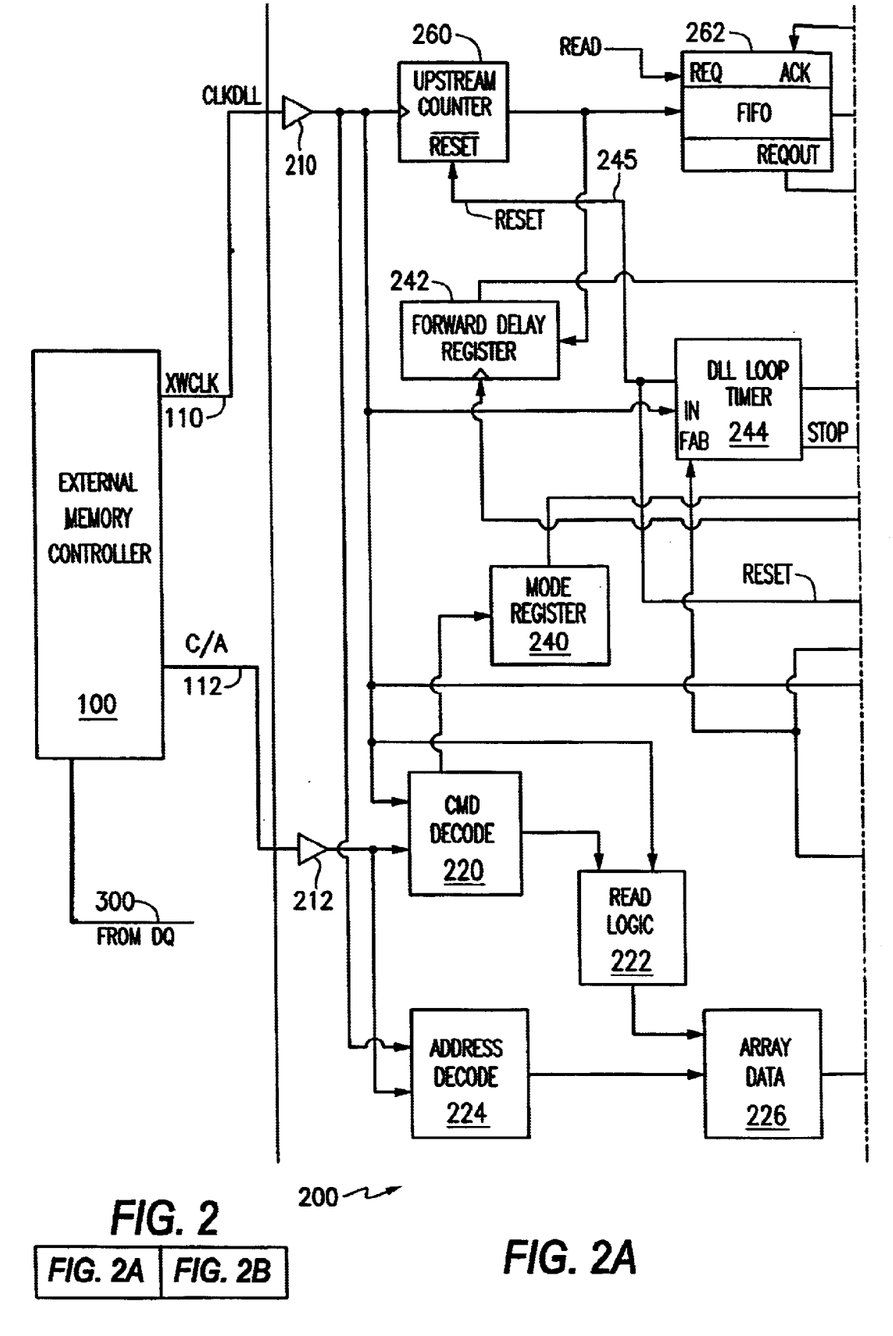
FIG. 2 is a block diagram illustrating a second exemplary embodiment of the invention.
Figure 2B:
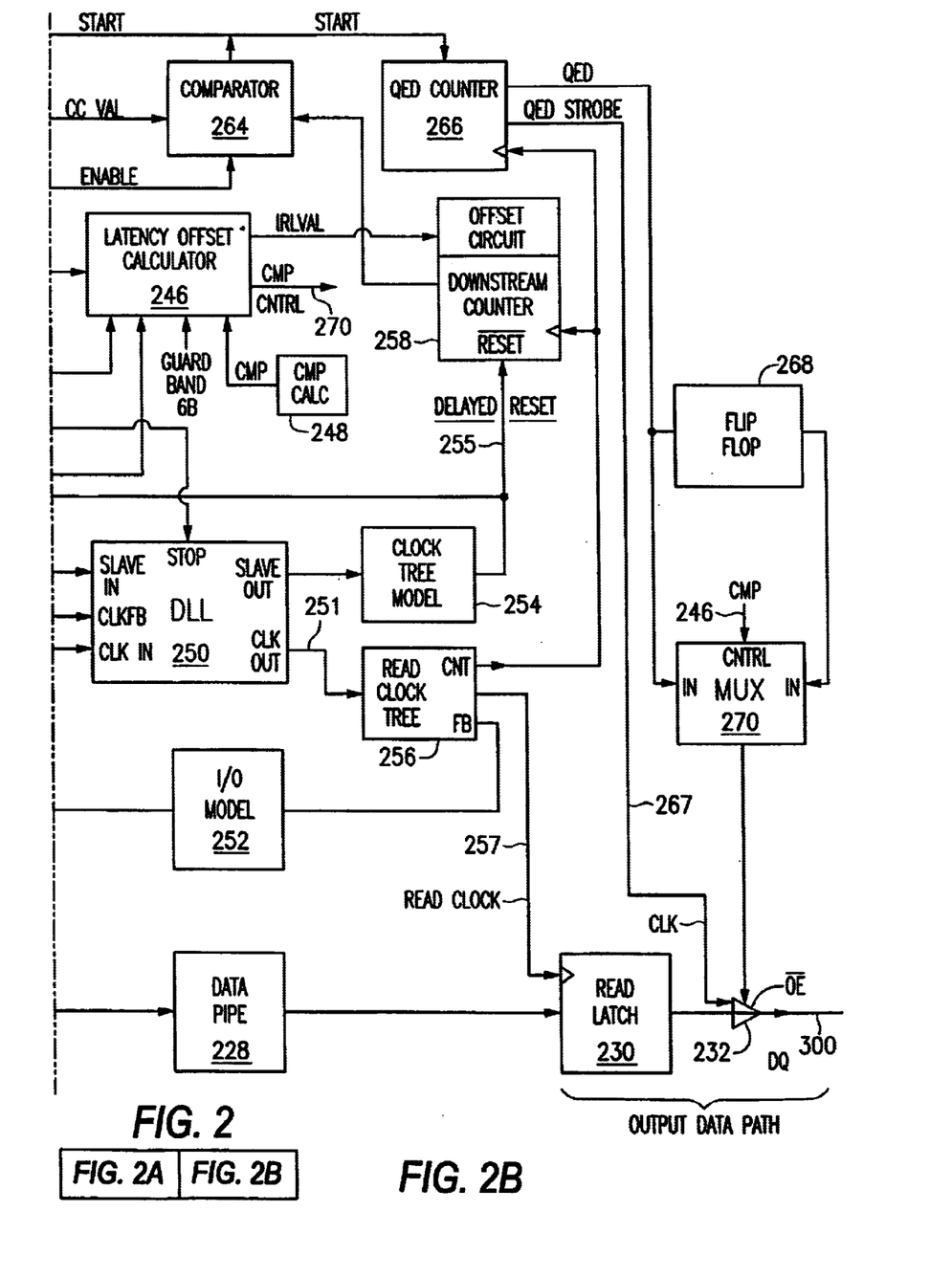

FIG. 2 illustrates a second exemplary embodiment of the present invention. This embodiment is similar to that of FIG. 1, but eliminates the adder in the FIFO 262, and modifies the count of the downstream counter 258 by the number of cycles equivalent to the internal read latency value (IRLVAL) supplied by the latency offset calculator 246. Downstream counter 258 has logic that allows the counter to be loaded with an offset value. Thus, the internal read latency value (IRLVAL) is added to or subtracted from the clock cycles counted by the downstream counter 258 before the counted value is supplied to comparator 264.

If X cycles need to be added to the delay lock loop in order to synchronize data output from memory device 200 with memory controller 300, the offset value loaded into the downstream counter 258 is −X. If X cycles need to be subtracted from the delay lock loop in order to synchronize data output from memory device 200 with memory controller 300, the offset value loaded into the downstream counter 258 is +X.

As a result, the value supplied to the FIFO 262 from the upstream counter 260 is unmodified by the latency offset calculator 246; hence, an adder is not required. The comparator 264 still signals when the downstream counter 258 reaches the identical value of the upstream counter 260 after a read command is received.

Figure 4:
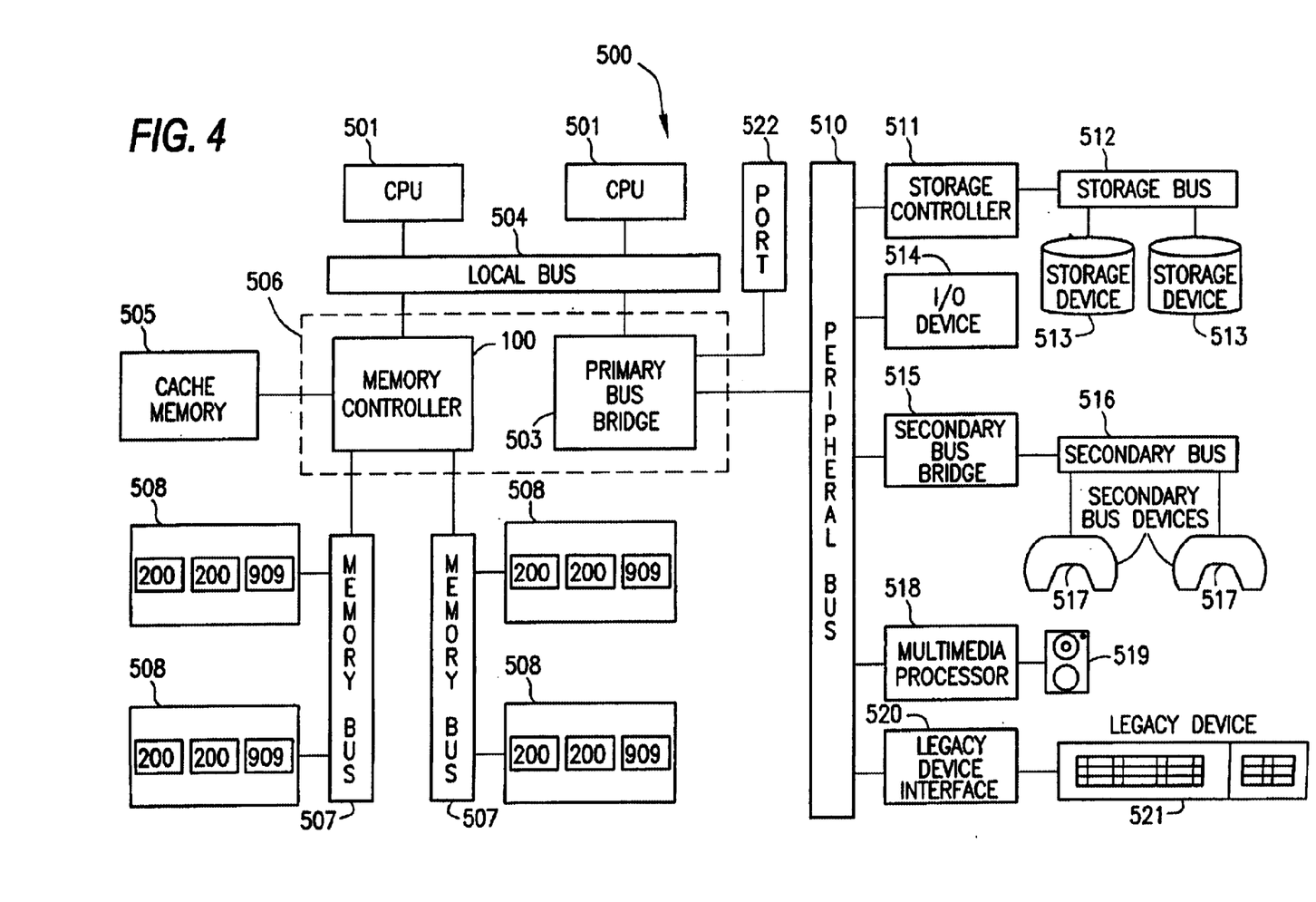
FIG. 4 is a block diagram depicting the memory device of FIGS. 1 and 2 implemented within a processor system.

FIG. 4 illustrates an exemplary processing system 506 that utilizes a DRAM memory device 200 in accordance with the embodiments of the present invention disclosed above in FIGS. 1–3. FIG. 4 depicts an exemplary personal computer or work station architecture. The processing system 500 includes one or more processors 501 coupled to a local bus 504. A memory controller 100 and a primary bus bridge 503 are also coupled to the local bus 504. The processing system 500 may include multiple memory controllers 100 and/or multiple primary bus bridges 503. The memory controller 100 and the primary bus bridge 503 may be integrated as a single device 506.

The memory controller 100 is also coupled to one or more memory buses 507. Each memory bus accepts memory components 508 that include at least one memory device 200. The memory components 508 may be a memory card or a memory module. Examples of memory modules include single inline memory modules SIMMs and dual inline memory modules DIMMs. The memory components 508 may include one or more additional devices 509. For example, in a SIMM or DIMM, the additional device 509 might be a configuration memory, such as serial presences detect SPD memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers, which are bus masters or which support direct memory access DMA, the memory controller 100 may implement a cache coherency protocol. If the memory controller 100 is coupled to a plurality of memory buses 516, each memory bus 516 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also be coupled to one or more special purpose high speed ports 522. In a personal computer, for example, the special purpose port might be the Accelerated Graphics Port AGP, used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any type of peripheral. For example, the I/O device 514 may be a local area network interface, such as an Ethernet card. The secondary bus bridge may be used to interface additional devices via another bus to the processing system. For example, the secondary bus bridge may be a universal serial port USB controller used to couple USB devices 517 via to the processing system 500. The multimedia processor 518 may be a sound card, a video capture card, or any other type of media interface, which may also be coupled to one additional device such as speakers 519. The legacy device interface 520 is used to couple legacy devices, for example, older style keyboards and mice, to the processing system 500.

The processing system 500 illustrated in FIG. 4 is only an exemplary processing system with which the invention may be used. While FIG. 4 illustrates a processing architecture especially suitable for a general purpose computer, such as a personal computer or a workstation, it should be recognized that well known modifications could be made to configure the processing system 500 to become more suitable for use in a variety of applications. For example, many electronic devices that require processing may be implemented using a simpler architecture that relies on a CPU 501 coupled to memory components 508 and/or memory buffer devices 504. These electronic devices may include, but are not limited to audio/video processors and recorders, gaming consoles, digital television sets, wired or wireless telephones, navigation devices (including system based on the global positioning system GPS and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions could be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method of operating a memory device comprising:
   counting an external clock signal;
   counting an internal read clock signal derived from said external clock signal;
   holding a count value of said external clock signal in response to a read command;
   determining if a predetermined relationship exists between the held count value of said external clock signal and count value of said internal read clock signal; and placing read data on an output line in response to the existence of said predetermined relationship.

2. The method of claim 1 further comprising adjusting at least one of said held count value and said count value of said internal read clock before performing said determining operation.

3. The method of claim 2, wherein said held count value is adjusted.

4. The method of claim 2, wherein said internal read clock count value is adjusted.

5. The method of claim 3, wherein said determining operation comprises comparing an adjusted held count value with said internal read clock count value and issuing a command to place read data on said output line when said compared values are equal.

6. The method of claim 4, wherein said determining operation comprises comparing said held count value with an adjusted internal read clock count value and issuing a command to place read data on said output line when said compared values are equal.

7. The method of claim 5, wherein said issuing occurs within a predetermined number of external clock signal cycles following said read command.

8. The method of claim 6, wherein said issuing occurs within a predetermined number of external clock signal cycles following said read command.

9. The method of claim 5, wherein said adjusted held count value is determined at least in part from a stored read latency value.

10. The method of claim 5, wherein said adjusted held count value is determined at least in part from a stored value representing the number of cycles required for a signal to traverse a processing path used to produce said internal read clock signal.

11. The method of claim of claim 5, wherein said processing path includes a delay lock loop.

12. The method of claim 5, wherein said adjusted held count value is determined at least in part from a stored value representing an approximate number of external cycles required for said read clock signal to be derived from said external clock signal.

13. The method of claim 5, wherein said adjusted held count value is determined at least in part from a stored value representing the number of external cycles of compensation required for read latency timing generation because of signal distribution delays and a read strobe preamble.

14. The method of claim 5, wherein said adjusted held count value is determined at least in part from a stored value representing the number of cycles that may safely be removed from said adjusted held count value and still place read data on said output line within a predetermined read latency.

15. The method of claim 6, wherein said adjusted held count value is determined at least in part from a stored read latency value.

16. The method of claim 6, wherein said adjusted held count value is determined at least in part from a stored value representing the number of cycles required for a signal to traverse a processing path used to produce said internal read clock signal.

17. The method of claim 6, wherein said processing path includes a delay lock loop.

18. The method of claim 6, wherein said adjusted held count value is determined at least in part from a stored value representing an approximate number of external cycles required for said read clock signal to be derived from said external clock signal.

19. The method of claim 6, wherein said adjusted held count value is determined at least in part from a stored value representing the number of external cycles of compensation required for read latency timing generation because of signal distribution delays and a read strobe preamble.

20. The method of claim 6, wherein said adjusted held count value is determined at least in part from a stored value representing the number of cycles that may safely be removed from said adjusted held count value and still place read data on said output line within a predetermined read latency.

21. The method of claim 1 further comprising latching read data for output with said internal read clock signal; and placing said latched read data on said output line in response to the existence of said predetermined relationship.

22. A method of operating a memory device comprising:

counting an external clock signal in an upstream counter;

counting an internal read clock signal derived from said external clock signal in a downstream counter;

storing a count value of said upstream counter in response to a read command;

determining if a predetermined relationship exists between the stored count value of said external clock signal and count value of said downstream counter; and placing read data on an output line in response to the existence of said predetermined relationship.

23. The method of claim 22 further comprising adjusting one of said held count value and said count value of said downstream counter before performing said determining operation.

24. The method of claim 23, wherein said stored count value is adjusted.

25. The method of claim 23, wherein said count value of said downstream counter is adjusted.

26. The method of claim 24, wherein said determining operation comprises comparing an adjusted stored count value with said count value of said downstream counter and issuing a command to place read data on said output line when said compared values are equal.

27. The method of claim 24, wherein said determining operation comprises comparing said stored count value with an adjusted count of said downstream counter value and issuing a command to place read data on said output line when said compared values are equal.

28. The method of claim 26, wherein said issuing occurs within a predetermined number of external clock signal cycles following said read command.

29. The method of claim 27, wherein said issuing occurs within a predetermined number of external clock signal cycles following said read command.

30. The method of claim 26, wherein said adjusted stored count value is determined at least in part from a read latency value.

31. The method of claim 26, wherein said adjusted stored count value is determined at least in part from a stored value representing the number of cycles required for a signal to traverse a processing path to produce said internal read clock signal.

32. The method of claim 26, wherein said adjusted stored count value is determined at least in part from a stored value representing the approximate number of clock cycles separating the count of said upstream counter from the count of said downstream counter.

33. The method of claim 26, wherein said adjusted stored count value is determined at least in part from a value representing a number of external cycles of compensation required due to signal distribution delays and a read strobe preamble.

34. The method of claim 26, wherein said adjusted stored count value is determined at least in part from a value representing the number of cycles that may safely be removed from said adjusted stored count value and still place read data on said output line with a predetermined read latency.

35. The method of claim 27, wherein said adjusted count value is determined at least in part from a read latency value.

36. The method of claim 27, wherein said adjusted count value is determined at least in part from a value representing the number of cycles required for a signal to traverse a processing path used to produce said internal read clock signal.

37. The method of claim 27, wherein said adjusted count value is determined at least in part from a value representing the approximate number of clock cycles separating the count of said upstream counter from the count of said downstream counter.

38. The method of claim 27, wherein said adjusted count value is determined at least in part from a value representing a number of external cycles of compensation required due to signal distribution delays and a read strobe preamble.

39. The method of claim 26, wherein said adjusted count value is determined at least in part from a value representing the number of cycles that may safely be removed from said adjusted count value and still place read data on said output line with a predetermined read latency.

40. The method of 22 further comprising causing said upstream counter to begin counting said external clock signals and said downstream counter to begin counting said internal read clock signals in response to an initialization sequence of said memory device.

41. The method of claim 40, wherein said initialization sequence comprises:
generating a signal which starts said upstream counter;
passing said signal through a first processing path having the same signal timing characteristics as a second signal processing path which produces said internal read clock signal from said external clock signal; and
starting said downstream counter when said signal passes through said first processing path.

42. The method of claim 22 further comprising tracking a timing difference between said external clock signal and said internal read clock signal for maintaining a read latency between said signals.

43. A method of operating a memory device comprising:
receiving an external clock signal at said memory device;
updating a first counter based on said external clock signal;
developing an internal clock signal from said external clock signal;
updating a second counter based on said internal clock signal; and
outputting data onto an output line based on a predetermined relationship between said first counter and said second counter.

44. The method of claim 43, wherein said predetermined relationship maintains a predetermined latency between the clock signals.

45. A memory device comprising:
a first counter for counting an external clock signal;
a second counter for counting an internal read clock signal produced from said external clock signal;
a storing circuit for storing a count value in said first counter in response to a read command; and
a circuit for causing read data to be placed on an output line in response to a determination of the existence of a predetermined relationship between said stored count value and a count value in said second counter.

46. The memory device of claim 45 further comprising a count adjusting circuit for adjusting at least one of the stored count value and count value in said second counter for use in said determination.

47. The memory device of claim 46, wherein said count adjusting circuit adjusts said stored count value.

48. The memory device of claim 46, wherein said count adjusting circuit adjusts said count value in said second counter.

49. The memory device of claim 47, wherein said adjusting circuit performs said adjusting at least in part in response to a read latency value.

50. The memory device of claim 45 further comprising an initialization circuit for starting said upstream counter and said downstream counter.

51. A processor system comprising
a processor; and
a memory device for exchanging data with said processor, said memory device comprising:
a first counter for counting an external clock signal;
a second counter for counting an internal read clock signal produced from said external clock signal;
a storing circuit for storing a count value in said first counter in response to a read command; and
a circuit for causing read data to be placed on an output line in response to a determination of the existence of a predetermined relationship between said stored count value and a count value in said second counter.

52. The memory device of claim 51 further comprising a count adjusting circuit for adjusting at least one of the stored count value and count value in said second counter for use in said determination.

53. The memory device of claim 52, wherein said count adjusting circuit adjusts said stored count value.

54. The memory device of claim 52, wherein said count adjusting circuit adjusts said count value in said second counter.

55. The memory device of claim 53, wherein said adjusting circuit performs said adjusting at least in part in response to a read latency value.

56. The memory device of claim 51 further comprising an initialization circuit for starting said upstream counter and said downstream counter.

* * * * *